(12) United States Patent
Wang et al.

(10) Patent No.: US 10,692,987 B2
(45) Date of Patent: Jun. 23, 2020

(54) IC STRUCTURE WITH AIR GAP ADJACENT TO GATE STRUCTURE AND METHODS OF FORMING SAME

(71) Applicant: GLOBALFOUNDRIES INC., Grand Cayman (KY)

(72) Inventors: Haiting Wang, Clifton Park, NY (US); Guowei Xu, Ballston Lake, NY (US); Hui Zang, Guilderland, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 20 days.

(21) Appl. No.: 16/164,867

(22) Filed: Oct. 19, 2018

(65) Prior Publication Data

US 2020/0127109 A1  Apr. 23, 2020

(51) Int. Cl.
| | |
|---|---|
| *H01L 29/66* | (2006.01) |
| *H01L 29/49* | (2006.01) |
| *H01L 23/535* | (2006.01) |
| *H01L 21/768* | (2006.01) |
| *H01L 29/78* | (2006.01) |

(52) U.S. Cl.
CPC ...... *H01L 29/4991* (2013.01); *H01L 21/7682* (2013.01); *H01L 21/76805* (2013.01); *H01L 21/76895* (2013.01); *H01L 23/535* (2013.01); *H01L 29/6653* (2013.01); *H01L 29/66795* (2013.01); *H01L 29/7851* (2013.01)

(58) Field of Classification Search
CPC ............ H01L 29/4991; H01L 21/7682; H01L 29/6653; H01L 21/76805; H01L 23/535; H01L 29/7851; H01L 29/66795; H01L 21/76895
See application file for complete search history.

(56) References Cited

U.S. PATENT DOCUMENTS

| | | | |
|---|---|---|---|
| 5,736,446 A | 4/1998 | Wu | |
| 6,001,695 A | 12/1999 | Wu | |
| 6,104,007 A | 8/2000 | Lerner | |
| 7,741,663 B2 | 6/2010 | Hause et al. | |
| 8,390,079 B2 | 3/2013 | Horak et al. | |
| 8,637,930 B2 * | 1/2014 | Ando | H01L 29/66803 257/347 |
| 9,515,156 B2 | 12/2016 | Besser et al. | |
| 9,911,824 B2 * | 3/2018 | Ching | H01L 29/785 |

* cited by examiner

*Primary Examiner* — David Vu
(74) *Attorney, Agent, or Firm* — Francois Pagette; Hoffman Warnick LLC

(57) ABSTRACT

The disclosure provides an integrated circuit (IC) structure including a first spacer on a semiconductor fin adjacent a first portion of the gate structure, and having a first height above the semiconductor fin; a second spacer on the semiconductor fin adjacent the first spacer, such that the first spacer is horizontally between the first portion of the gate structure and a lower portion of the outer; and a gate cap positioned over the first portion of the gate structure and on the second spacer above the semiconductor fin. The gate cap defines an air gap horizontally between the first portion of the gate structure and an upper portion of the second spacer, and vertically between an upper surface of the first spacer and a lower surface of the gate cap.

20 Claims, 11 Drawing Sheets

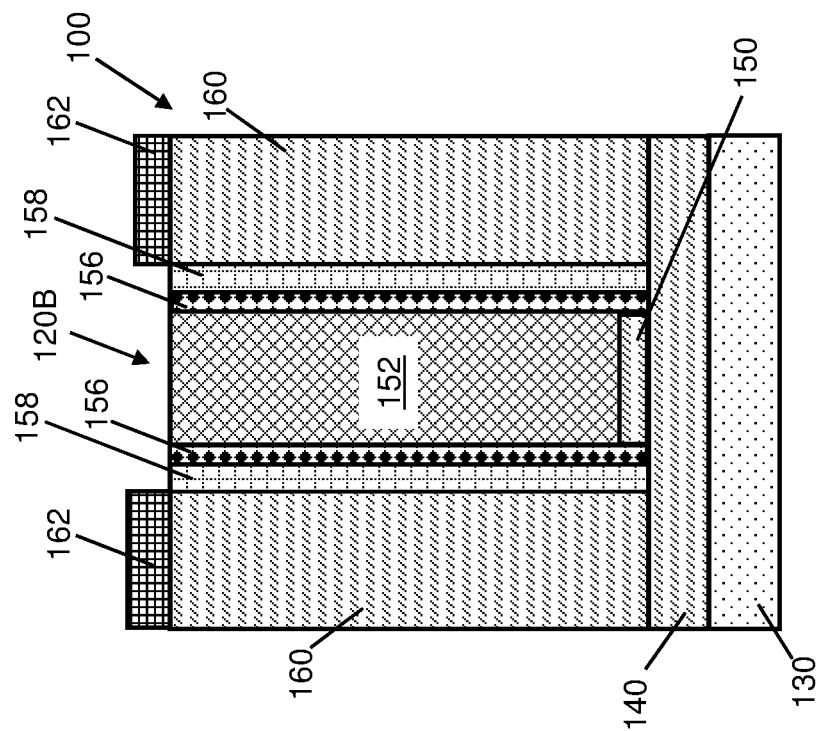
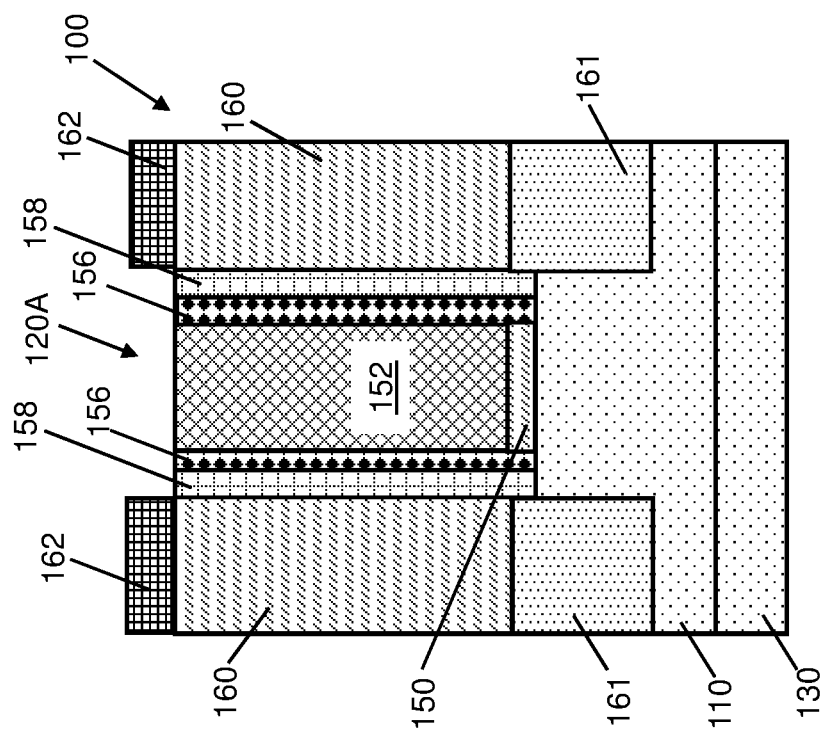

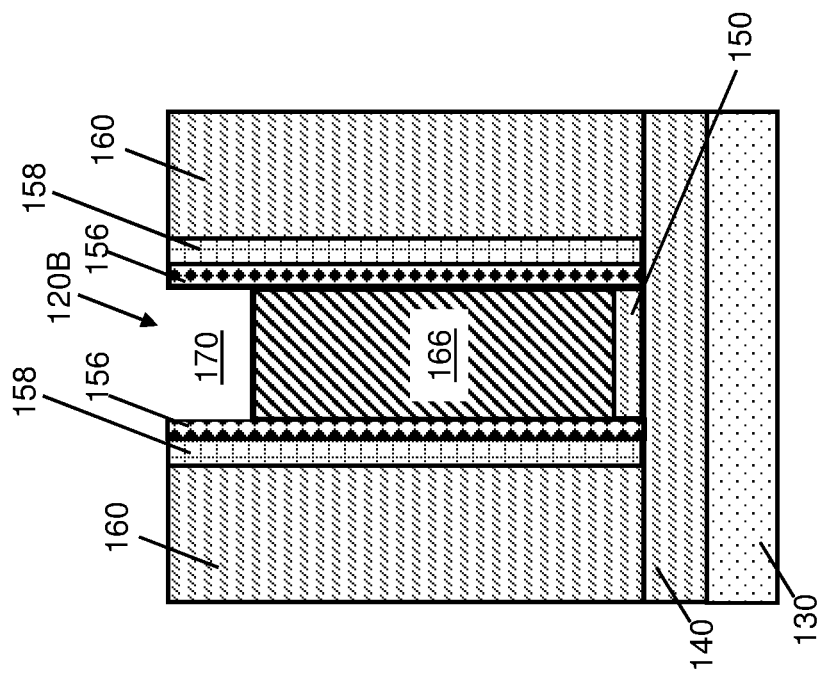
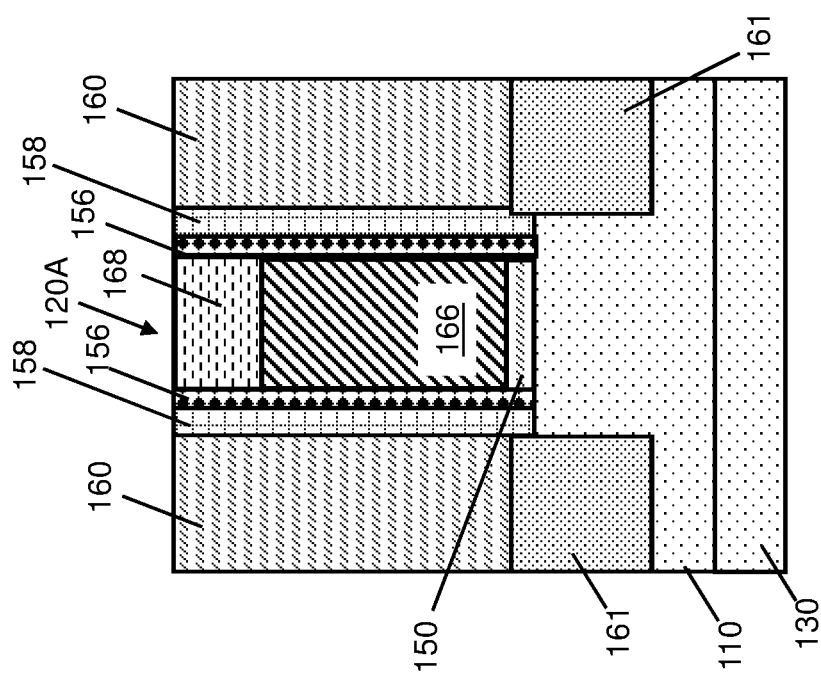

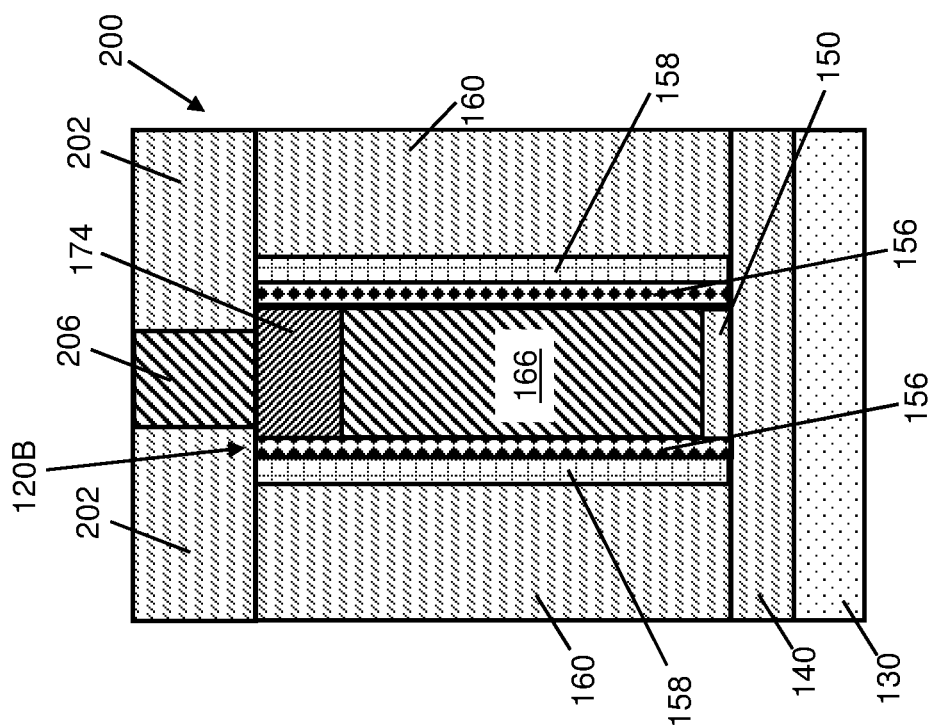
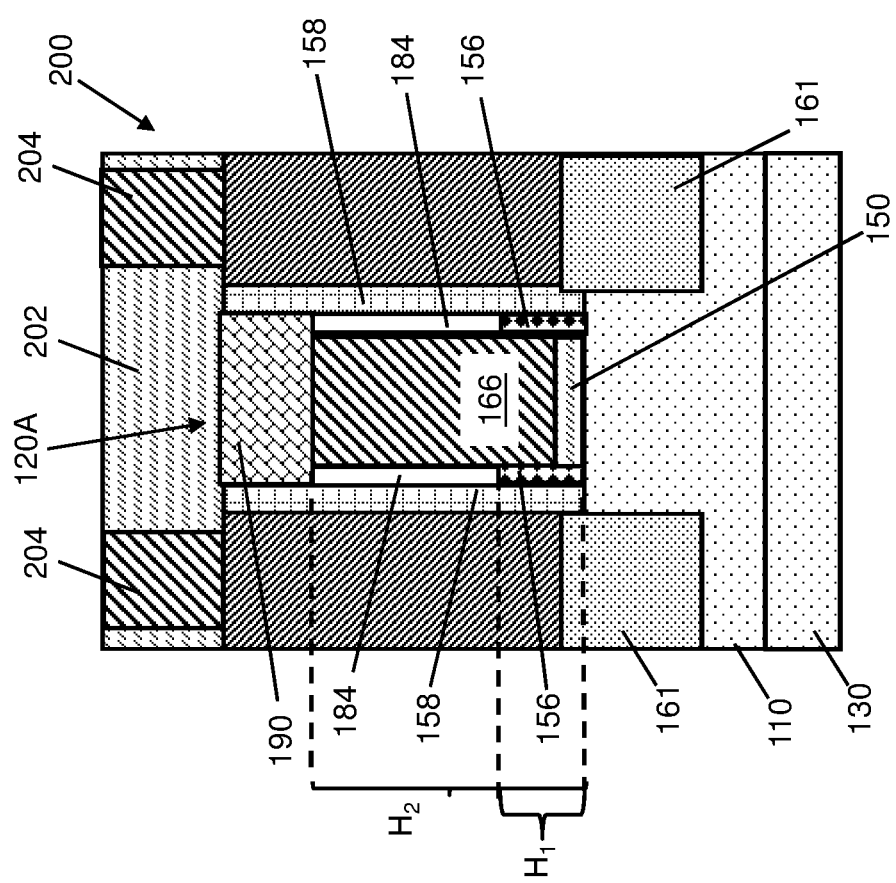
FIG. 21
FIG. 20 ional circuit (IC) structure, and structures associated with the disclosed methods. More particularly, the present application relates to forming IC components, e.g., transistors, by integrating an air gap between terminals of the transistor.

IC STRUCTURE WITH AIR GAP ADJACENT TO GATE STRUCTURE AND METHODS OF FORMING SAME

BACKGROUND

Technical Field

The present application relates to methods of forming an integrated circuit (IC) structure, and structures associated with the disclosed methods. More particularly, the present application relates to forming IC components, e.g., transistors, by integrating an air gap between terminals of the transistor.

Design systems are commonly used to create integrated circuits (ICs) and, in particular, to design front end of line (FEOL) components, e.g., transistors for providing active electrical functions of a device. As advances occur, smaller widths for wires and vias are provided. Additional design constrains imposed by smaller wire and via widths, e.g., requirements for uni-directional wiring at any metal layer, may create manufacturing challenges. The intended circuit structure must comply with several design rules before manufacture. Design rule spacing constraints can limit a variety of attributes, e.g., the maximum separation distance between adjacent gates in a cell array. Such constraints can affect the ability to form functional elements which connect gates and/or other structures together, e.g., two or more vias connecting to nearby positions of a single device layer, as well as the materials which may be used to form conductive components of a transistor. Under these circumstances, some materials may be more desirable than others in the final design structure. Some desirable materials, such as air gaps for providing a gas dielectric region, may be difficult to incorporate into existing processes due to the risk of altering nearby component features.

Air gaps may be particularly useful for decreasing the effective capacitance of a transistor, including FinFET transistors and other transistor designs. Reducing the effective capacitance of a transistor generally boosts the device performance in alternating current (AC) applications, which may otherwise require dielectric materials with a low dielectric constant (i.e., less than 3.9). However, rising device density reduces the possible locations where a circuit fabricator may form an air gap between gate and source or drain regions of a transistor. The need to form one or more spacers directly adjacent the gate of a transistor further compounds this issue. Failing to form air gap regions in a transistor may be a significant risk to device reliability.

SUMMARY

A first aspect of the present disclosure provides a method of forming an integrated circuit (IC) structure, the method including: forming a first spacer on a semiconductor fin adjacent a gate structure, the gate structure being positioned over the semiconductor fin; forming a second spacer on the semiconductor fin adjacent the first spacer, such that the first spacer is between the gate structure and the second spacer, wherein the second spacer has a different material composition from the first spacer; removing a portion of the first spacer to reduce a height of the first spacer over the semiconductor fin; and forming an air gap horizontally between the gate structure and the second spacer by forming a gate cap on the gate structure over the first spacer and on an upper portion of the second spacer.

A second aspect of the present disclosure provides an integrated circuit (IC) structure including: a semiconductor fin on a substrate; a gate structure over the substrate, the gate structure having a first portion extending transversely across the semiconductor fin; a first spacer on the semiconductor fin adjacent the first portion of the gate structure and having a first height above the semiconductor fin; a second spacer on the semiconductor fin adjacent the first spacer, wherein the first spacer is horizontally between the first portion of the gate structure and the second spacer, and a height of the second spacer above the semiconductor fin is greater than a height of the first spacer above the semiconductor fin; and a gate cap positioned over the first portion of the gate structure and on the second spacer above the semiconductor fin, wherein the gate cap defines an air gap horizontally between the first portion of the gate structure and the second spacer, and vertically between an upper surface of the first spacer and a lower surface of the gate cap.

A third aspect of the present disclosure provides an integrated circuit (IC) structure including: a semiconductor fin on a substrate; a gate structure over the substrate, the gate structure having a first portion extending transversely across the semiconductor fin, and a second portion positioned over the substrate and horizontally displaced from the semiconductor fin; a first spacer having a first portion on the semiconductor fin adjacent the first portion of the gate structure, and a second portion on the substrate adjacent the second portion of the gate structure, wherein the first portion of the first spacer has a first height above the semiconductor fin; a second spacer having a first portion on the semiconductor fin adjacent the first portion of the first spacer, and a second portion on the substrate adjacent the second portion of the first spacer, wherein the first spacer is horizontally between the gate structure and the second spacer; and a gate cap positioned over the first portion of the gate structure and on the first portion of the second spacer above the semiconductor fin, wherein the gate cap defines an air gap horizontally between the first portion of the gate structure and the first portion of the second spacer, and vertically between an upper surface of the first portion of the first spacer and a lower surface of the gate cap.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIG. 2 shows a first cross-sectional view, along line 2-2 of FIG. 1, of the initial structure according to embodiments of the disclosure.

FIG. 3 shows a second cross-sectional view, along line 3-3 of FIG. 1, of the initial structure according to embodiments of the disclosure.

FIG. 8 shows, along the first cross-section, forming a gate mask on the gate metal according to embodiments of the disclosure.

FIG. 9 shows, along the second cross-section, forming the gate mask on the gate metal according to embodiments of the disclosure.

FIG. 20 shows, along the first cross-section, forming a local interconnect region to an IC structure according to embodiments of the disclosure.

FIG. 21 shows, along the second cross-section, forming a local interconnect region to an IC structure according to embodiments of the disclosure.

Figure 1:
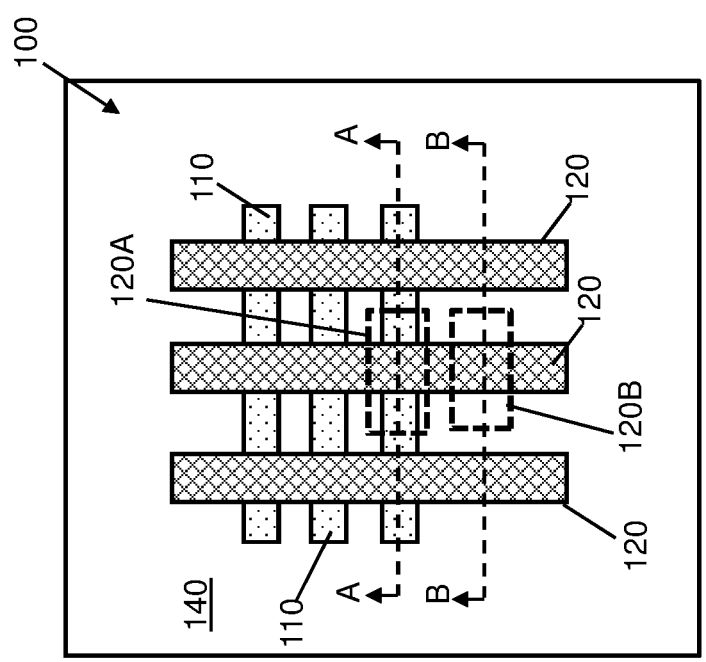
FIG. 1 shows a plan view of an initial structure to be processed according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

FIG. 1 provides a plan view of a structure 100 to be processed according to embodiments of the disclosure. The example structure 100 of FIG. 1 provides one preliminary set of materials targeted for use with embodiments of the disclosure, but it is understood that embodiments of the disclosure may be implemented on different designs without significant changes to the various example techniques discussed herein. Structure 100 can include a set (i.e., one or more) of fins 110 extending in parallel with each other, with three fins 110 being provided as an example. Structure 100 may also include a set (i.e., one or more) gate structures 120 extending transversely over fins 110. A shallow trench isolation 140 (shown without cross-hatching in FIG. 1 solely for clarity) of structure 100, may be positioned underneath and/or adjacent to fin(s) 110 and gate structure(s) 120. Gate structure(s) 120 may be subdivided into a first portion 120A and a second portion 120B. First portion 120A may be a portion of gate structure 120 positioned over corresponding fin(s) 110 in structure 100. Second portion 120B may be a portion of gate structure(s) 120 positioned over STI(s) 140. In some cases, first portion 120A may be known as a "source drain contact area" while second portion 120B may be known as a "gate contact area." References to gate structure(s) 120 may refer to first portion 120A and/or second portion 120B. Gate structure(s) 120 may be structurally continuous and identical in composition through first and second portions 120A, 120B, with the sole distinction between portions 120A, 120B being their location over semiconductor fin(s) 110 or STI(s) 140. It is also understood that first and second portions 120A, 120B may be horizontally separated with respect to each other as shown in FIG. 1. Further illustration of methods according to the disclosure is provided by reference to a first lateral cross-section of FIG. 1 along line A-A, depicted in even-numbered FIGS. 4, 6, 8, 10, etc., and a second lateral cross-section of FIG. 1 along line B-B, depicted in odd-numbered FIGS. 5, 7, 9, 11, etc. It should be emphasized that fins 110 are absent from structure 100 along the second lateral cross-section.

Referring to FIGS. 2-3, together, methods according to the disclosure may include forming various masking materials on structure 100. Each fin 110 may be formed from an underlying semiconductor substrate 130, e.g., by removing targeted portions of substrate 130 to a predetermined depth, causing the non-removed portions to form fins 110 directly on substrate 130. Substrate 130 may include, e.g., one or more currently-known or later developed semiconductive substances generally used in semiconductor manufacturing, including without limitation: silicon (e.g., crystal silicon), germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

Structure 100 may include at least one shallow trench isolation (STI) 140 positioned on substrate 130, as well as between semiconductor fins 110 (FIGS. 1, 2) and gate structures 120. Each STI 140 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

Each gate structure 120 may lack one or more functional components used in a complete IC structure, and may include one or more dummy gates to be processed at a different stage of forming a product. Such components may be eventually replaced with functional elements in other process steps. Gate structures 120 thus may cover one or more semiconductor fins 110 positioned above substrate 130, e.g., by coating exposed sidewalls and an upper surface of fin(s) 110. Gate structures 120 may include multiple subcomponents. Each gate structure 120 may include a gate dielectric film 150. First portion 120A may include gate dielectric film 150 on an upper surface of semiconductor fin 110. Second portion 120B may include gate dielectric film 150 on an upper surface of STI(s) 140. Gate structure 120 may include a precursor gate 152 formed on gate dielectric 150 in each portion 120A, 120B. Precursor gate 152 may be formed on gate dielectric film 150, e.g., to allow other portions of a structure to be formed before gate structure 120 is replaced with functional conductive components.

A first spacer 156 may be formed adjacent to gate structure 120, and a second spacer 158 may be formed adjacent to first spacer 156. First spacer 156 may be positioned on adjacent vertical sidewalls of precursor gate 152. First spacer(s) 156 may be provided as one or more bodies of insulating material formed on exposed portions of STI(s) 140 and/or gate structure(s) 120, e.g., by deposition, thermal growth, etc. First spacer(s) 156 may be formed on or adjacent to gate structure(s) 120 to electrically and physically separate gate structure(s) 120 from other components of structure 100. First and second spacers 156, 158 each may include a different material composition, but in any case may include a set of low-K dielectric materials, i.e., dielectric materials with a dielectric constant of at most approximately 3.9. First spacer 156, for example, may include one or more insulative oxide materials. In some cases, first spacer may include one or more insulative materials included in STI(s) 140 or a different insulative material. For instance, first spacer 156 may include silicon dioxide ($SiO_2$). Second spacer(s) 158 may have a composition different from first spacer(s) 156, thereby allowing each spacer 156, 158 to be modified (e.g., via selective etching) independently from each other. Second spacer 158 may be provided as a region of one or more nitride insulators, e.g., silicon nitride (SiN), with or without other insulating materials being included therein. In any case, spacers 156, 158 may be formed consecutively via any currently-known or later-developed procedure to form a bilayer spacer adjacent gate structure 120.

To form initial structure 100, an insulator 160 may be deposited on structure 100, i.e., over semiconductor fin(s) 110, gate structure(s) 120, substrate 130, and STI(s) 140. Insulator 160 may be formed by non-selective or selective deposition, such that insulator 160 initially covers at least fin(s) 110 and gate structure(s) 120. Insulator 160 may include one or more of the oxide materials listed as example materials for STI(s) 140, including one or more flowable oxide materials, or it may include a different oxide material. STI(s) 140 and insulator 160 are shown as different components, e.g., due to STI(s) 140 being formed before gate structure(s) 120, and insulator 160 being contemporaneously formed on fin(s) 110, gate structure(s) 120, and STI(s) 140.

As shown specifically in FIG. 2, each fin 110 may include a set of epitaxial regions 161 positioned below insulator 160 and adjacent to first portion 120A. Epitaxial regions 161 may be formed within fin 110, e.g., by forming openings within fin 110 and epitaxially growing another semiconductor material within the openings, thereby forming epitaxial regions 161 with a different material composition from the remainder of fin 110. Gate structure 120 and spacers 156, 158 may shield a portion of the fin 110 when epitaxial regions 161 are being formed. Epitaxial regions 161 may include the same semiconductor material of fin 110, or a different semiconductor material, but with dopants therein. Introducing dopants into epitaxial regions 161 may form the eventual source/drain regions of a device formed from structure 100. Epitaxial regions 161, after being doped, may have a different composition from the remainder of fin 110. To form epitaxial regions 161, selected portions of fin 110 may be implanted with a strain-inducing material, such as silicon germanium or silicon carbon, formed on fins composed of silicon, silicon germanium, and/or silicon carbon. The dopants used to form epitaxial regions 161 may be introduced in situ or an implantation process may be performed to affect only epitaxial regions 161 of structure 100. According to an example, fin 110 is not previously doped before epitaxial regions 161 are formed within structure 100. A doping process may be performed to dope fin(s) 110 and epitaxial regions 161. If a lightly doped source/drain region is desired, the doping can occur after forming gate structures 120, but before forming spacer(s) 156, 158.

Before an air gap may be formed from first spacer 156, the disclosure may include forming source, drain, and gate terminals of the transistor with spacers 156, 158 in their original positions and sizes. To prepare structure 100 for processing, the disclosure may include forming a photoresist layer 162 on insulator 160, such that photoresist layer 162 covers insulator 160. A "photoresist layer" generally refers to a material used in photolithography to transfer a pattern from a mask onto a wafer. Photoresist layer 162 may be a liquid deposited on the surface of structure 100 as a thin film, then solidified by low temperature anneal. Portions of structure 100 thus may be susceptible to processing, e.g., various etchants as discussed herein, while other materials covered by photoresist layer 162 will be protected.

Figure 4:
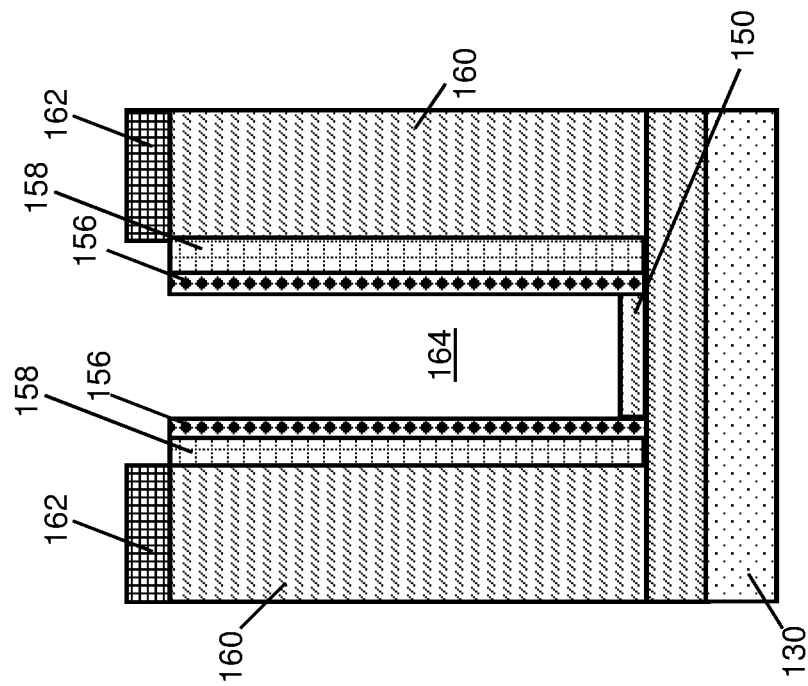
FIG. 4 shows, along the first cross-section, removing a gate structure to expose a semiconductor fin according embodiments of to the disclosure.
Figure 5:
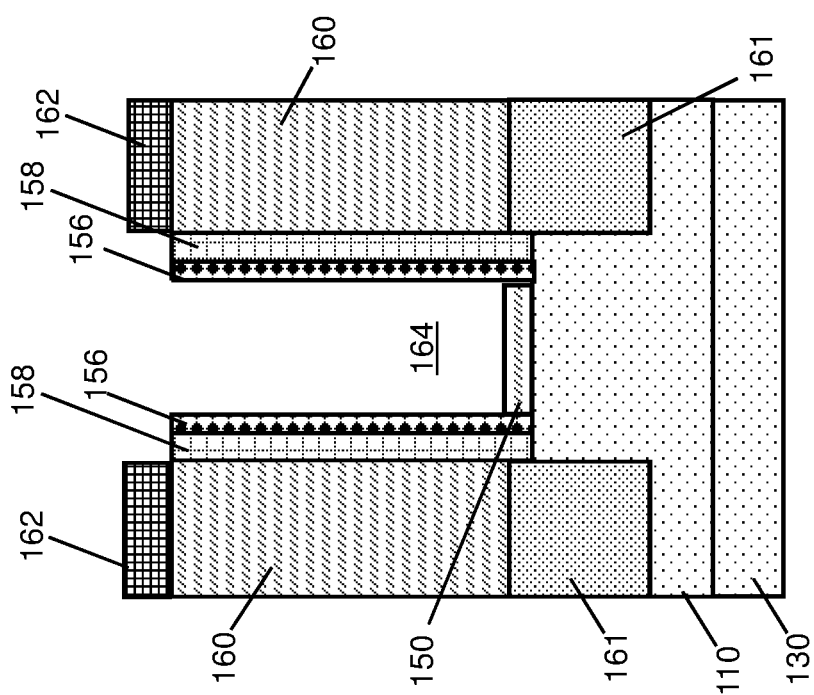
FIG. 5 shows, along the second cross-section, removing the gate structure according to embodiments of the disclosure.

Referring to FIGS. 4 and 5 together, the disclosure may include removing precursor gate 152 (FIG. 2) to form an opening 164. Subsequent processing may include forming conductive metals within opening 164, in place of precursor gate 152. Insulator 160 and photoresist 162 may protect spacers 156, 158 and other materials from being removed with precursor gate 152. Precursor gate 152 may be removed by way of a downward directional etch, or alternatively by way of an etchant selective to insulator 160 and photoresist 162. Etching generally refers to the removal of material from a substrate (or structures formed on the substrate), and is often performed with a mask in place so that material may selectively be removed from certain areas of the substrate, while leaving the material unaffected in other areas of the substrate. There are generally two categories of etching, (i) wet etch, and (ii) dry etch. Wet etch is performed with a solvent (such as an acid or a base) which may be chosen for its ability to selectively dissolve a given material (such as oxide), while, leaving another material (such as polysilicon or nitride) relatively intact. This ability to selectively etch given materials is fundamental to many semiconductor fabrication processes. A wet etch will generally etch a homogeneous material (e.g., nitride) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotopic. Ion milling, or sputter etching, bombards the wafer with energetic ions of noble gases which approach the wafer approximately from one direction, and therefore this process is highly anisotopic. Reactive-ion etching (RIE) operates under conditions intermediate between sputter and plasma etching and may be used to produce deep, narrow features, such as STI trenches. In any case, opening 164 may be formed over fin(s) 110 and first portion 120A, in addition to second portion 120B over STI 140. Although FIG. 6 shows an example of forming opening 164 in one gate structure 120, it is understood that multiple gate structures 120 on semiconductor fin 110 may be modified to form multiple openings 162 in further embodiments.

Figure 6:
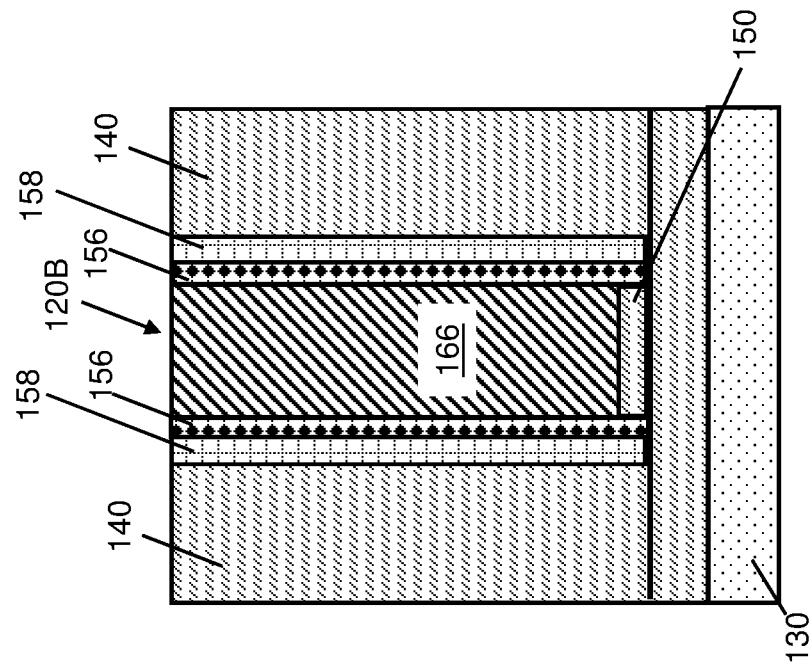
FIG. 6 shows, along the first cross-section, forming a gate metal on the semiconductor fin according to embodiments of the disclosure.
Figure 7:
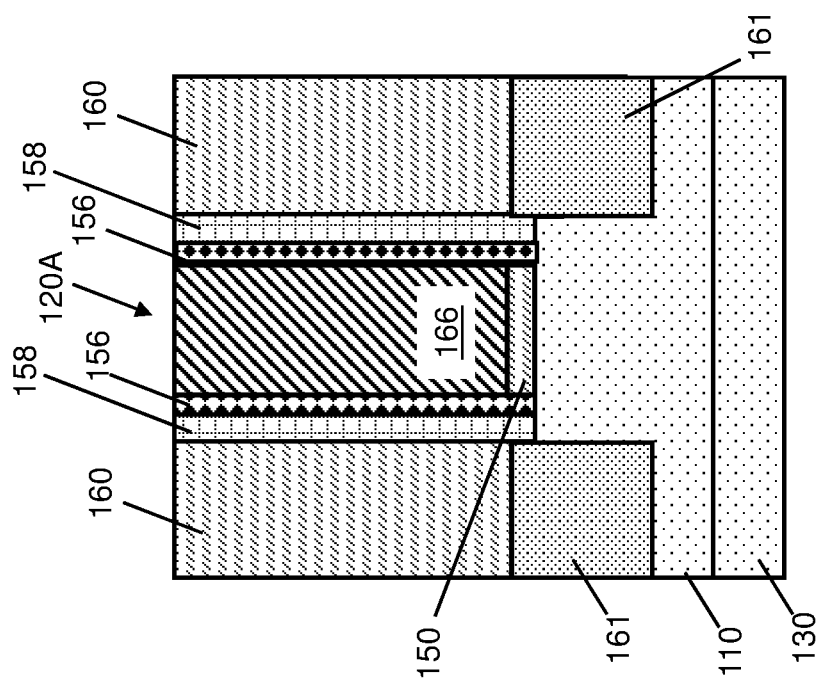
FIG. 7 shows, along the second cross-section, forming the gate metal according to embodiments of the disclosure.

Referring now to FIGS. 6 and 7, embodiments of the disclosure may include bulk deposition of a gate metal 166 to form conductive portions of a transistor gate. Materials suitable for use as gate metal 166 may include, e.g., tungsten (W), beryllium (Be), gold (Au), platinum (Pt), palladium (Pt), and/or other high work function metals conventionally formed in metallic portions of a gate structure. Gate metal 166 may be formed by deposition, followed by removing photoresist 162 (FIGS. 2-5), e.g., by stripping, etching, etc. After removing photoresist 162, remaining metallic and/or insulative residue may be removed by planarization. The planarization may cause the upper surface of gate metal 166 to be substantially coplanar with the upper surface of insulator 160. It is understood that the forming of opening(s) 164 (FIGS. 4, 5) and gate metal(s) 166 may be implemented following other process steps of the disclosure in various alternative embodiments. For the sake of example, further processing is discussed using an example in which gate metal 166 is formed before spacers 156, 158 are processed to form an air gap.

Continuing to FIGS. 8 and 9, various embodiments may include forming various insulative materials on gate metal 166 to protect gate metal 166 while forming conductive contacts to epitaxial region(s) 161. FIGS. 8 and 9 depict, at different portions of gate structure 120, recessing gate metal 166 to a desired depth. The recessing of gate metal 166 may be completed with the aid of one or more photoresist layers, selective etching, and/or any other procedure for removing portions of gate metal 166 without affecting insulator 160 and/or spacers 156, 158. After recessing gate metal 166 to the desired depth, continued processing may include forming an insulator cap 168 on gate metal 166 of at least first portion 120A. Although insulator cap 168 may initially be deposited within second portion 120B, any material on gate metal 166 of second portion 120B may be targeted and removed by forming an intermediate mask (not shown) on gate structure 120 and etching back second portion 120B to form a gate opening 170 over gate metal 166 of second portion 120B. Insulator cap 168 will protect gate metal 166 of first portion 120A from being processed as source/drain and gate materials are formed on other components. Insulator cap 168 can eventually be removed to expose gate metal 166 at first portion 120A, allowing an air gap to be formed from spacers 156, 158.

Figure 11:
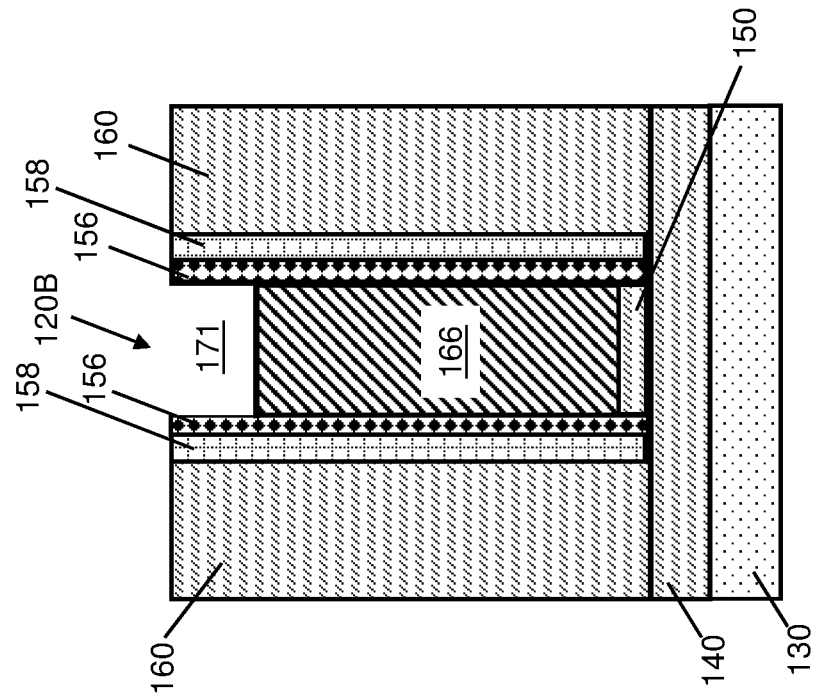
FIG. 11 shows the second cross-section while forming openings to source and drain regions of the semiconductor fin according to embodiments of the disclosure.
Figure 10:
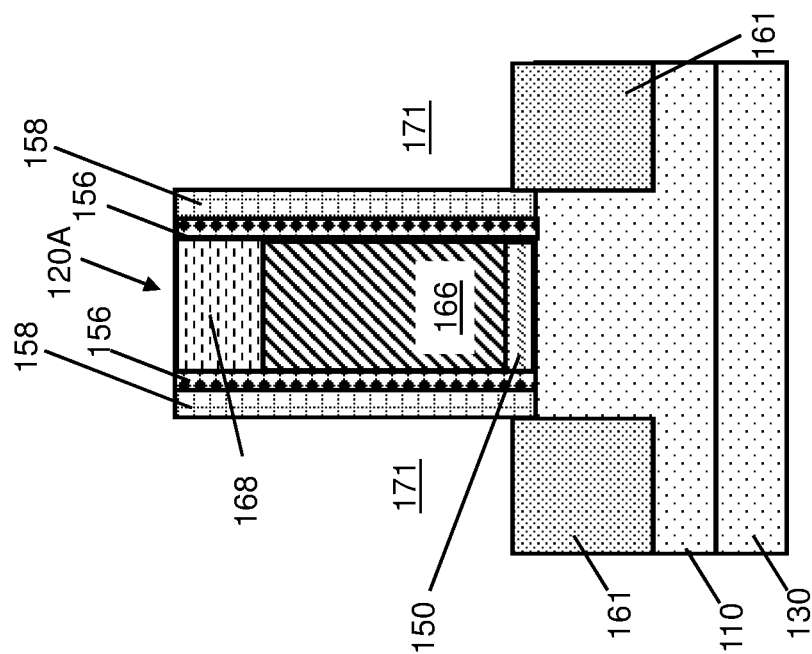
FIG. 10 shows, along the first cross-section, forming openings to source and drain regions of the semiconductor fin according to embodiments of the disclosure.

Turning to FIGS. 10 and 11 together, continued processing may include preparing the structure to form the source and drain terminals of a transistor structure. For example, FIG. 10 depicts the etching of insulator 160 adjacent first and second spacers 156, 158 at first portion 120A to form openings 171. At least a portion of epitaxial regions 161 may be revealed when forming each opening 171. Openings 171 may shaped for subsequent depositing of conductive contacts to source/drain regions of a transistor structure. The applied etchant may be non-selective to the composition of first and second spacers 156, 158, as well as the previously-recessed gate metal 166. Such etchants may include, e.g., ammonia (NH$_3$), nitrogen trifluoride (NF$_3$), and/or similar nitride-based etchants selective to oxide insulator materials. The presence of insulator cap 168, formed of a material non-selective to the applied etchant, prevents underlying portions of gate metal 166 from being removed as openings 171 are formed.

Figure 13:
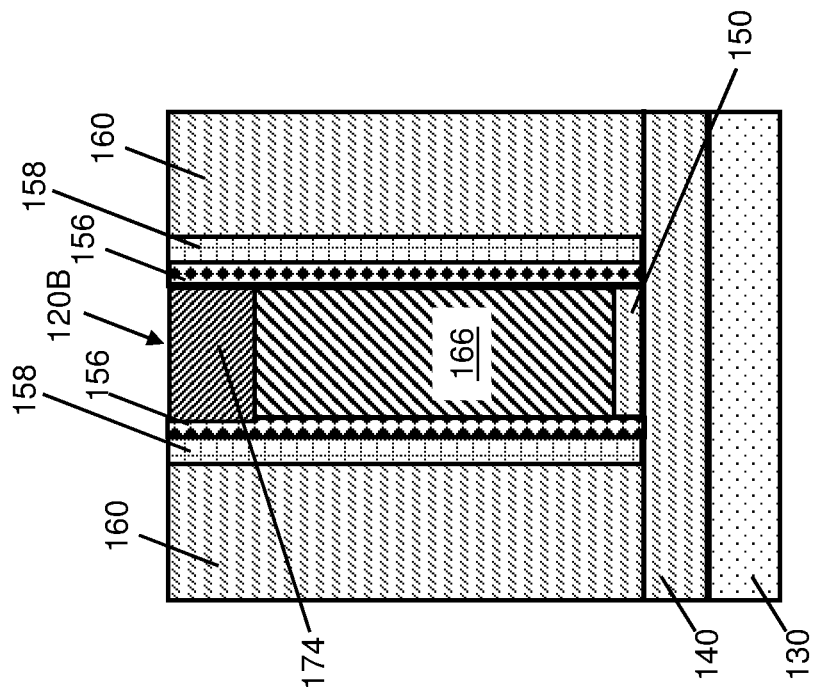
FIG. 13 shows, along the second cross-section, forming a contact to the gate metal according to embodiments of the disclosure.
Figure 12:
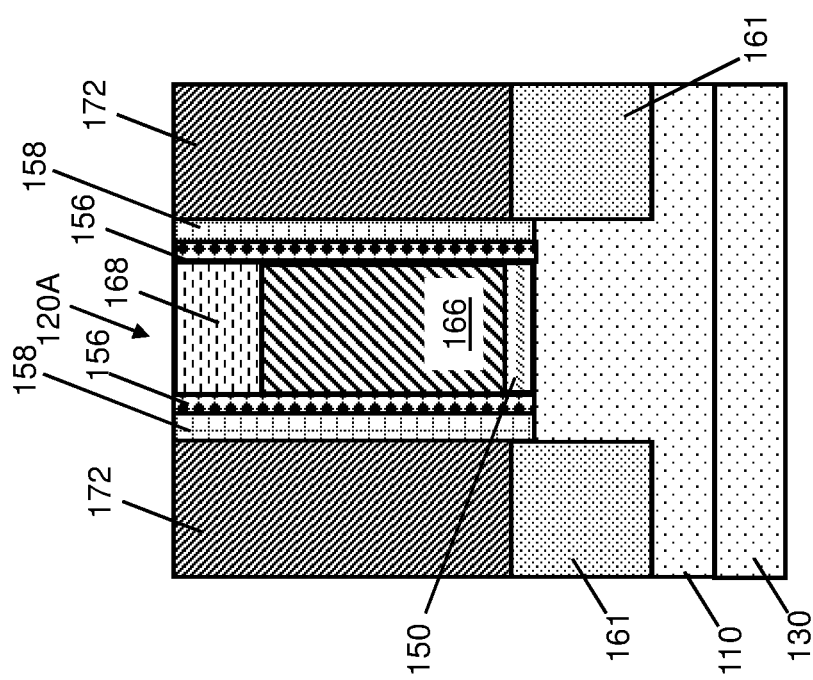
FIG. 12 shows, along the first cross-section, forming contacts to source/drain regions of the semiconductor fin according to embodiments of the disclosure.

Continuing to FIGS. 12 and 13, each opening 170 (FIGS. 8, 9), 171 (FIGS. 8-11) may be filled with conductive metals to electrically connect the eventual transistor structure to overlying wiring layers. As shown in FIG. 12, a pair of source/drain contacts 172 may be deposited within each opening 171 adjacent first portion 120A. The depositing of source/drain contacts 172 may include depositing a thin layer of conductive metal on epitaxial regions 161 and annealing the metal to form a conductive silicide contact (not shown) before depositing a conductive metal (e.g., copper, aluminum, etc.) over epitaxial regions 161 to form source/drain contacts 172. Conductive metals also may be deposited on gate metal 166 of second portion 120B to form a gate contact 174 to gate metal 166. In any case, first and second spacers 156, 158 in each portion 120A, 120B may retain their original forms adjacent gate metal 166 as contacts 172, 174 are formed. Contacts 172, 174 may also include refractory metal liners (not shown) formed on sidewalls thereof to prevent electromigration degradation of the electrical contacts. Such liners may include, e.g., a nitride compound including one or more refractory metals, and in various examples may include tantalum nitride (TaN), titanium nitride (TiN), etc. Continued processing of the structure will modify spacers 156, 158 to form an air gap to further isolate gate metal 166 and source/drain contacts 172 from each other.

Figure 15:
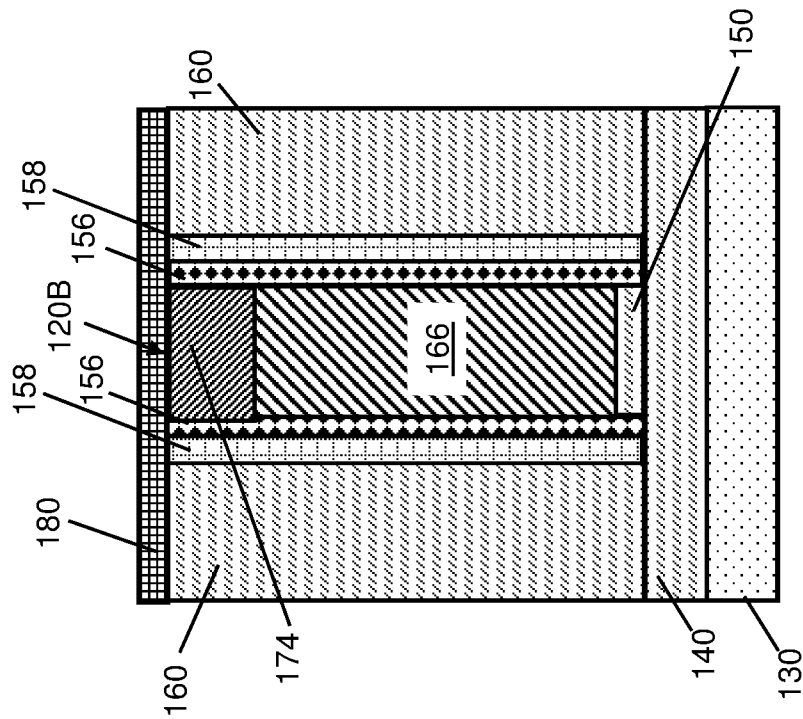
FIG. 15 shows the second cross-section while removing the gate mask according to embodiments of the disclosure.
Figure 14:
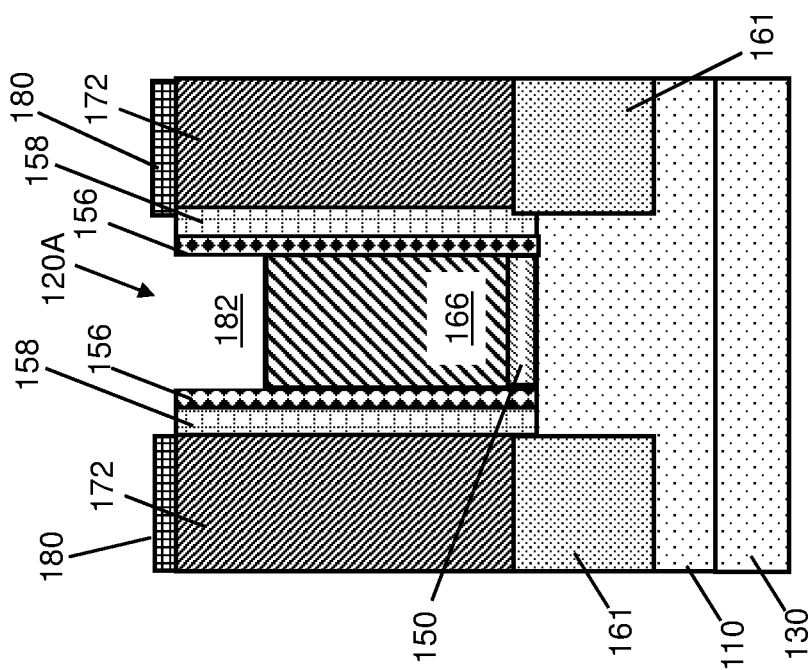
FIG. 14 shows, along the first cross-section, removing the gate mask according to embodiments of the disclosure.

FIGS. 14 and 15 depict a preliminary process for targeting first portion 120A to form an air gap according to the disclosure. Here, a temporary mask 180 includes, e.g., one or more of the example masking materials discussed elsewhere relative to photoresist layer 162 (FIGS. 2-5), or other masking materials suitable to protect underlying conductive and/or insulating materials from being removed by etching. As shown, temporary mask 180 may not be positioned on spacers 156, 158 and insulator cap 168 (FIGS. 8, 10, 12) of first portion 120A. With temporary mask 180 in place, the disclosure may include removing insulator cap 168 from first portion 120A, e.g., by downward directional etching. In some cases, the etching of insulator cap 168 may include reactive ion etching (RIE) or other processes suitable to remove insulator cap 168. In other cases, insulator cap 168 may be removed by selective etching, thus causing spacers 156, 158 and/or gate metal 166 to remain intact. Removing insulator cap 168 forms a spacer opening 182 over gate metal 166 at first portion 120A. Spacer opening 182 also exposes upper portions of each spacer 156, 158 adjacent source/drain contacts 172.

Figure 17:
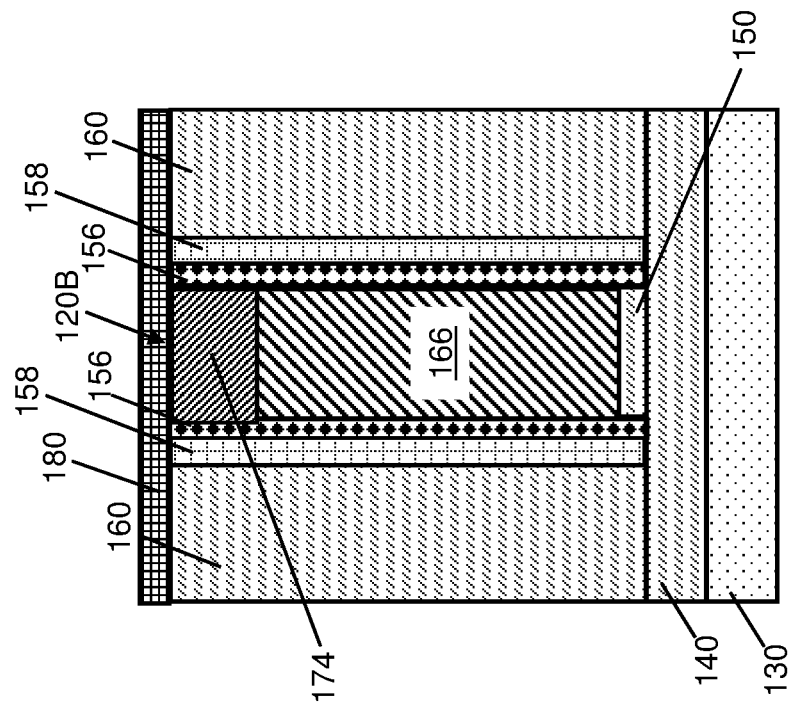
FIG. 17 shows the second cross-section while removing the first spacer according to embodiments of the disclosure.
Figure 16:
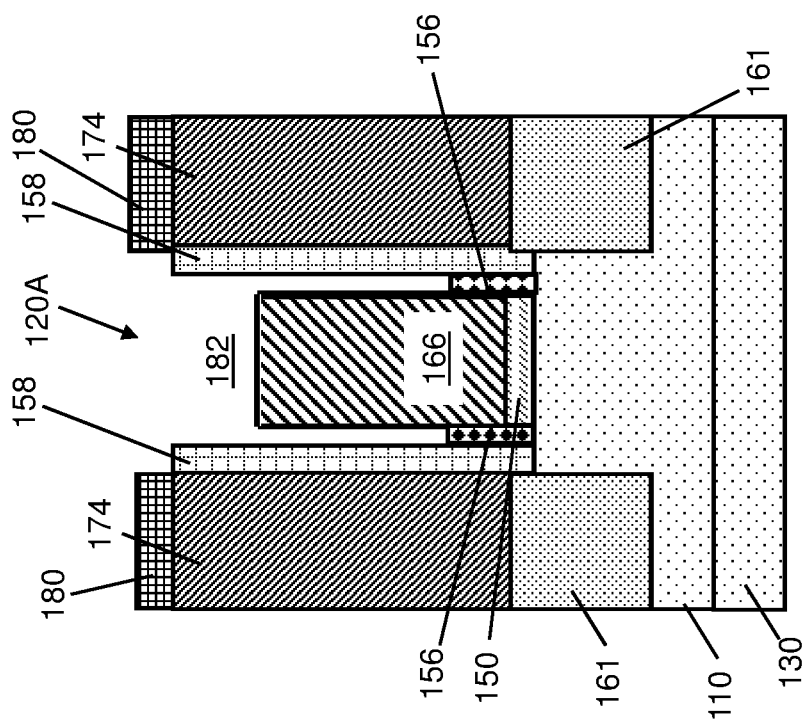
FIG. 16 shows, along the first cross-section, forming portions of the first spacer according to embodiments of the disclosure.

Continuing to FIGS. 16 and 17, continued processing may include removing portions of first spacer 156 to reduce the height of first spacer 156 over semiconductor fin 110. As shown in FIG. 17, temporary mask 180 may protect spacers 156, 158 at second region 120B while other portions of spacers 156, 158 at first region 120A are processed. As noted elsewhere herein, first and second spacers 156, 158 may have different material compositions. The difference in compositions may allow first spacer(s) 156 to be recessed independently from second spacer(s) 158, as well as gate metal 166. First spacer 156 in one example may include one or more oxide insulator materials, while second spacer 158 may include one or more nitride materials. The composition of each spacer 156, 158 may include different materials in further implementations. Where first spacer 156 includes oxide, the disclosure may include applying an oxide-selective etchant to recess first spacer 156. In other embodiments, other selective etchants and/or etching techniques may be used to recess first spacer 156 independently of second spacer 158. In any case, first spacer 156 may be recessed to a reduced height over semiconductor fin 110. At least a portion of first spacer 156 may remain intact on semiconductor fin 110, e.g., by controlling the amount and/or timing of the etching to lower the height of first spacer 156. The etching may cause a portion of gate metal 166 at first portion 120A to be horizontally separated from second spacer(s) 158.

Figure 19:
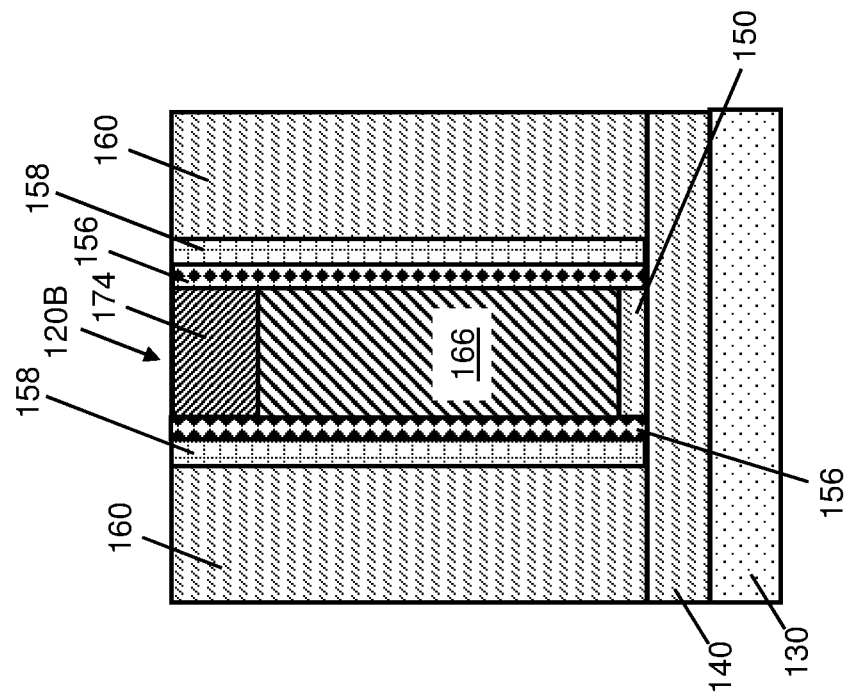
FIG. 19 shows the second cross-section while forming the gate cap according to embodiments of the disclosure.
Figure 18:
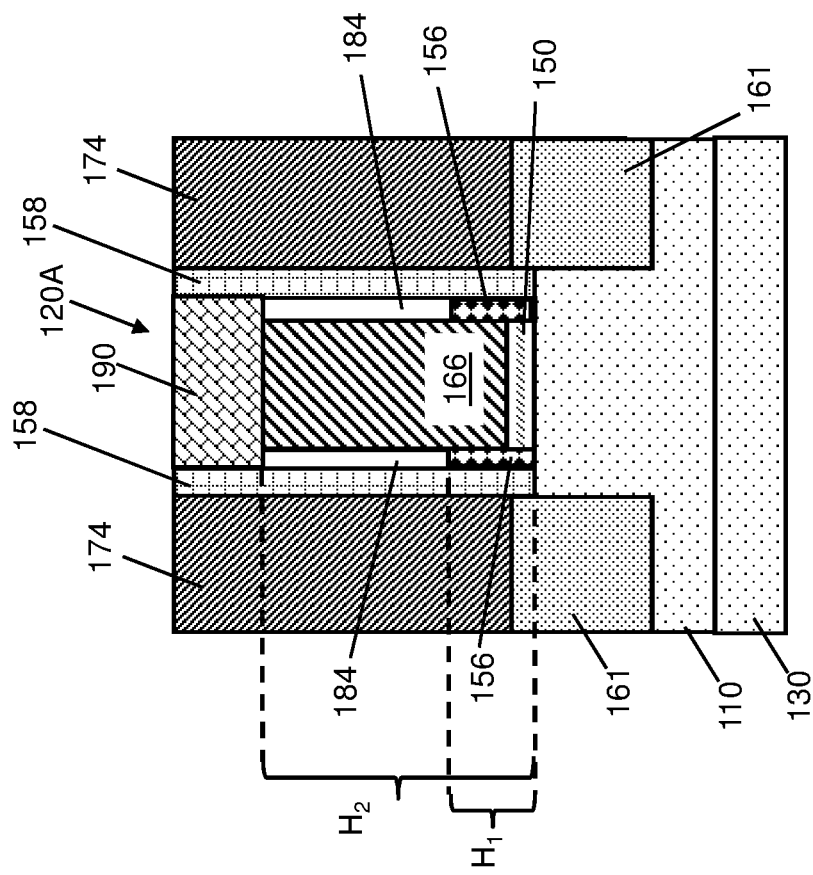
FIG. 18 shows, along the first cross-section, forming a gate cap to define an air gap according to embodiments of the disclosure.

FIGS. 18 and 19 depict forming an air gap 184 at first portion 120A. As shown, air gap 184 may be horizontally and vertically enclosed by other materials, and may be defined as a region previously occupied by first spacer 156. To form air gap 184, the disclosure may include forming a gate cap 190 on gate metal 166. Temporary mask 180 (FIGS. 14-17) may be removed, e.g., by stripping, before gate cap 190 is formed. Gate cap 190 may be formed by non-selectively depositing insulative material on gate metal 166, second spacer 158, source/drain contacts 174, as well as the upper surface of second portion 120B, and then planarizing the deposited insulative material, e.g., via chemical mechanical planarization (CMP). CMP may include contacting deposited materials with a slurry of materials configured to erode previously-deposited materials (e.g., insulators). Through planarization or controlled deposition, gate cap 190 may have an upper surface coplanar with the upper surface of second spacer 158 and source/drain contacts 174 in first portion 120A. Gate cap 190 may have the same material composition as first or second spacer 156, 158. In an example embodiment, gate cap 190 may include silicon nitride (SiN), other nitride materials, and/or more generally may include other currently known or later developed insulating materials. After being formed gate cap 190 will be absent from second portion 120B. Due to the small horizontal thickness of air gap 184 (e.g., at most approximately four nanometers (nm), the deposited gate cap 190 will not be deposited inside, and/or migrate into, air gap 184 to a significant degree. The horizontal thickness of air gap 184 may be controlled to prevent any portion of gate cap 190 from migrating into air gap 184. The above-noted example of air gap 184 being five nm thick will prevent downward migration of insulative material into air gap 184, and it is understood that other similar thicknesses will similarly prevent deposited insulator materials from entering, or subsequently migrating, into air gap 184. In an example embodiment, insulator material of gate cap 190 may be completely absent from air gap 184. In another example embodiment, insulator material of gate cap 190 may protrude downwardly into air gap 184 to a depth of no more than approximately 0.50 nm. In the latter case, insulator material of gate cap 190 remains substantially absent from air gap 184.

Air gap 184 is positioned horizontally between gate metal 166 and second spacer 158, as well as vertically between the remaining portion of first spacer 156 and gate cap 190. At this stage, first spacer 156 may have a first height $H_1$ above semiconductor fin 110 that is significantly less than the corresponding second height $H_2$ of second spacer 158 above semiconductor fin 110. According to an example, first height $H_1$ of first spacer 156 above semiconductor fin 110 may be at most approximately twenty nm. Second spacer 158 may have a second height $H_2$ above semiconductor fin 110 that is significantly greater than first height $H_1$. In an example implementation, second height $H_2$ of second spacer 158 may be at least approximately thirty nm, and in some cases may be at least approximately eighty nm. In any case, second height $H_2$ of second spacer 158 above semiconductor fin 110 may be greater than first height $H_1$ of first spacer 156 above semiconductor fin 110. Air gap 184 may be positioned entirely above semiconductor fin 110 and first spacer 156, and thus may be absent from second portion 120B. This property of air gap 184 may stem from first spacer 156 being recessed only above semiconductor fin 110, while being protected by temporary mask 180 (FIGS. 14-17) adjacent second portion 120B.

FIGS. 20 and 21 illustrate an IC structure 200 according to embodiments of the disclosure. IC structure 200 may include air gap 184 vertically above first spacer 156, and horizontally between source/drain contact 172 and gate metal 166. Air gap 184 may be present at first portion 120A, but absent from second portion 120B. IC structure 200 may include semiconductor fin 110 on substrate 130, and the transversely-extending gate structure 120 with first and second portions 120A, 120B as discussed herein. First spacer 156 may be positioned on semiconductor fin 110 adjacent first portion 120A. First spacer 156 may have first height $H_1$ above semiconductor fin 110 as noted elsewhere herein. Second spacer 158 may also be positioned on semiconductor fin 110, and may have a second height $H_2$ significantly greater than that of first spacer 156 as noted elsewhere herein. IC structure 200 includes gate cap 190 on an upper surface of gate metal 166, thus defining air gap 184 vertically between first spacer 156 and gate cap 190. Air gap 184 thus may be horizontally between second spacer 172 and gate metal 166. As also noted above, first and second spacers 156, 158 may have different material compositions to allow first spacer 156 to be etched, modified, etc., independently of second spacer 158.

Further processing of structure 200 may include forming connections to overlying portions of a device, e.g., various metal wiring levels for interconnecting devices, components, etc., formed on substrate 130. An inter-level dielectric (ILD) 202 may be formed above gate structures 120, insulator 160, gate cap 190, and other previously-formed materials, e.g., by deposition or other techniques of forming an insulative material on a structure. ILD 202 may include the same insulating material as STI(s) 140, insulator 160, or may include a different electrically insulator material. STI(s) 140, insulator 160, and ILD region 202 nonetheless constitute different components, e.g., due to STI(s) 140 and insulator 160 being formed before ILD 220.

Contacts to overlying circuit elements may be formed using an additional mask (not shown) on predetermined portions of ILD 202 while leaving other materials uncovered, applying a controlled amount of vertical etching to form openings to one or more contact sites, and then filling the openings with a conductor. Such contacts may include, e.g., a set of first contacts 204 (FIG. 20 only) extending from, e.g., the top of ILD 202, to source/drain contacts 172 adjacent gate structure 120. A second contact 206 (FIG. 21 only) may extend from the top of ILD 202 to gate contact 174 above second portion 120B. Each contact 204, 206 may include any currently known or later developed conductive material configured for use in an electrical contact, e.g., copper (Cu), aluminum (Al), gold (Au), etc. First and second contacts 204, 206 may additionally include refractory metal liners (not shown) positioned alongside ILD 202 to prevent electromigration degradation, shorting to other components, etc.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure comprising:
   a semiconductor fin on a substrate;
   a gate structure over the substrate, the gate structure having a first portion extending transversely across the semiconductor fin;
   a first spacer on the semiconductor fin adjacent the first portion of the gate structure and having a first height above the semiconductor fin;
   a second spacer on the semiconductor fin adjacent the first spacer, wherein the first spacer is horizontally between the first portion of the gate structure and the second spacer, and a height of the second spacer above the semiconductor fin is greater than a height of the first spacer above the semiconductor fin; and
   a gate cap positioned over the first portion of the gate structure and on the second spacer above the semiconductor fin, wherein the gate cap defines an air gap horizontally between the first portion of the gate structure and the second spacer, and vertically between an upper surface of the first spacer and a lower surface of the gate cap.

2. The IC structure of claim 1, wherein the first spacer includes an oxide spacer material, and wherein the second spacer includes a nitride spacer material.

3. The IC structure of claim 1, wherein the height of the first spacer above the semiconductor fin is less than a height of the second spacer above the semiconductor fin.

4. The IC structure of claim 1, wherein the air gap is positioned entirely above the semiconductor fin and the first spacer.

5. The IC structure of claim 1, further comprising a gate contact over a second portion of the gate structure, wherein the second portion of the gate structure is horizontally separated from the semiconductor fin.

6. The IC structure of claim 5, further comprising a set of source/drain contacts over the semiconductor fin, wherein the first spacer, the second spacer, and the air gap are positioned horizontally between the first portion of the gate structure and one of the set of source/drain contacts.

7. The IC structure of claim 1, wherein a horizontal width of the air gap between the first portion of the gate structure and the second spacer prevents migration of the gate cap into the air gap.

8. An integrated circuit (IC) structure comprising:
   a semiconductor fin on a substrate;
   a gate structure over the substrate, the gate structure having a first portion extending transversely across the semiconductor fin, and a second portion positioned over the substrate and horizontally displaced from the semiconductor fin;
   a first spacer having a first portion on the semiconductor fin adjacent the first portion of the gate structure, and a second portion on the substrate adjacent the second portion of the gate structure, wherein the first portion of the first spacer has a first height above the semiconductor fin;
   a second spacer having a first portion on the semiconductor fin adjacent the first portion of the first spacer, and a second portion on the substrate adjacent the second portion of the first spacer, wherein the first spacer is horizontally between the gate structure and the second spacer; and
   a gate cap positioned over the first portion of the gate structure and on the first portion of the second spacer above the semiconductor fin, wherein the gate cap defines an air gap horizontally between the first portion of the gate structure and the first portion of the second spacer, and vertically between an upper surface of the first portion of the first spacer and a lower surface of the gate cap.

9. The IC structure of claim 8, wherein the second portion of the first spacer is free of air gaps horizontally between the second portion of the gate structure and the second portion of the second spacer.

10. The IC structure of claim 8, wherein the first spacer includes an oxide spacer material, and wherein the second spacer includes a nitride spacer material.

11. The IC structure of claim 8, wherein the height of the first portion of the first spacer above the semiconductor fin is less than a height of the first portion of the second spacer above the semiconductor fin.

12. The IC structure of claim 8, further comprising a gate contact over the second portion of the gate structure.

13. The IC structure of claim 12, further comprising a set of source/drain contacts over the semiconductor fin, wherein the first portion of the first spacer, the first portion of the second spacer, and the first portion of the air gap are positioned horizontally between the first portion of the gate structure and one of the set of source/drain contacts.

14. An integrated circuit (IC) structure comprising:
a semiconductor fin on a substrate;
a shallow trench isolation positioned underneath the fin;
a gate structure over the substrate, the gate structure having a first portion extending transversely across the semiconductor fin and a second portion positioned over the shallow trench isolation;
an insulator adjacent the semiconductor fin and the gate structure; and
a gate cap positioned over the gate structure between the insulator and fin, wherein the gate cap defines an air gap horizontally surrounded by the insulator and vertically between the fin and gate cap.

15. The structure of claim 14, further comprising a first spacer on the semiconductor fin adjacent the first portion of the gate structure and having a first height above the semiconductor fin, wherein the first spacer includes an oxide spacer material.

16. The IC structure of claim 15, further comprising a second spacer on the semiconductor fin adjacent to the first spacer, wherein the height of the first spacer above the semiconductor fin is less than a height of the second spacer above the semiconductor fin.

17. The structure of claim 16, wherein the first spacer is free of air gaps horizontally between the second portion of the gate structure and the second portion of the second spacer.

18. The structure of claim 14, further comprising a gate contact over a second portion of the gate structure, wherein the second portion of the gate structure is horizontally separated from the semiconductor fin.

19. The IC structure of claim 14, wherein the shallow trench isolation is positioned between the semiconductor fin and the gate structure.

20. The structure of claim 14, further comprising a set of source/drain contacts over the semiconductor fin, wherein the air gap is positioned horizontally between the first portion of the gate structure and one of the set of source/drain contacts.

* * * * *